(12) United States Patent
Wang (10) Patent No.: US 10,497,685 B2
(45) Date of Patent: Dec. 3, 2019

(54) MICRO LED DISPLAY PANEL AND MANUFACTURING METHOD THEREOF

(71) Applicant: Shenzhen China Star Optoelectronics Technology Co., Ltd., Shenzhen, Guangdong (CN)

(72) Inventor: Zhiwu Wang, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/753,871

(22) PCT Filed: Jan. 17, 2018

(86) PCT No.: PCT/CN2018/073046
§ 371 (c)(1),
(2) Date: Nov. 6, 2018

(87) PCT Pub. No.: WO2019/127704
PCT Pub. Date: Jul. 4, 2019

(65) Prior Publication Data
US 2019/0198488 A1    Jun. 27, 2019

(30) Foreign Application Priority Data
Dec. 26, 2017    (CN) .......................... 2017 1 1434477

(51) Int. Cl.
*H01L 33/40* (2010.01)
*H01L 27/12* (2006.01)
(Continued)

(52) U.S. Cl.
CPC ........ *H01L 25/167* (2013.01); *H01L 27/1248* (2013.01); *H01L 33/405* (2013.01);
(Continued)

(58) Field of Classification Search
CPC ... H01L 27/12; H01L 27/124; H01L 27/1248; H01L 33/40; H01L 33/405; H01L 33/44;
(Continued)

(56) References Cited

U.S. PATENT DOCUMENTS

2014/0267683 A1    9/2014  Bibl et al.

FOREIGN PATENT DOCUMENTS

| CN | 103928491 A | 7/2014 |
|---|---|---|
| CN | 104838508 A | 8/2015 |

(Continued)

OTHER PUBLICATIONS

English translation to CN107331670A.*

*Primary Examiner* — Monica D Harrison
(74) *Attorney, Agent, or Firm* — Hemisphere Law, PLLC; Zhigang Ma (57) ABSTRACT

A Micro LED display panel and manufacturing method thereof are provided. The method of manufacturing Micro LED display panel, comprising providing a TFT substrate and opening a channel on the top of TFT substrate for exposing a source or a drain inside; preparing a planar layer on the top of the TFT substrate; opening a countersink hole on the planar layer; preparing a bottom electrode in the countersink hole and the channel; transferring a Micro LED chip to the bottom electrode; preparing a first passivation layer and totally covering the first passivation layer on the surface of the planar layer; opening a via hole on the surface of the first passivation layer for exposing the Micro LED chip; preparing a top electrode in the via hole.

14 Claims, 6 Drawing Sheets

(51) Int. Cl.
*H01L 25/16* (2006.01)
*H01L 33/62* (2010.01)
*H01L 33/60* (2010.01)
*H01L 33/44* (2010.01)

(52) U.S. Cl.
CPC .............. *H01L 33/44* (2013.01); *H01L 33/60* (2013.01); *H01L 33/62* (2013.01); *H01L 2933/0016* (2013.01); *H01L 2933/0025* (2013.01); *H01L 2933/0058* (2013.01); *H01L 2933/0066* (2013.01)

(58) Field of Classification Search
CPC ......... H01L 33/60; H01L 33/62; H01L 25/16; H01L 25/167
USPC ......................................................... 257/72
See application file for complete search history.

(56) References Cited

FOREIGN PATENT DOCUMENTS

| CN | 105870265 A | 8/2016 |
| CN | 105990398 A | 10/2016 |
| CN | 107331670 A | 11/2017 |

\* cited by examiner

MICRO LED DISPLAY PANEL AND MANUFACTURING METHOD THEREOF

RELATED APPLICATIONS

The present application is a National Phase of International Application Number PCT/CN2018/073046, filed Jan. 17, 2018, and claims the priority of China Application No. 201711434477.0, filed Dec. 26, 2017.

FIELD OF THE DISCLOSURE

The disclosure relates to a semiconductor manufacturing technical field, and more particularly to a Micro LED display panel and a method of manufacturing Micro LED display panel.

BACKGROUND

The power consumption of the Micro LED panel is one tenth of the LCD (Liquid Crystal Display), and the Micro LED panel is also has self-luminous character which is similar to the OLED (Organic Light-Emitting Diode), such that could decrease the distance between the pixels from millimeter level to the micrometer level, and the color saturation is closed to OLED. The volume and the weight of the Micro LED system could be narrowed, and has low power, fast response characters, and the important part is that the Micro Led does not has the defect of shading problem of the OLED. According to the advantageous above of the Micro LED, it makes popular research toward to the Micro LED.

While preparing the Micro LED chip on the TFT (thin film transistor), the P type of the semiconductor layer is upward, N type of the semiconductor layer is downward which are positioned inside the Micro LED chip. While the light from the emission layer positioned under the Micro LED chip to the P type the semiconductor layer, the whole-reflective function of the above P type the semiconductor layer causes partial light re-enters to the emission layer and transfers to hot energy, and also partial light will be absorbed by the organic layer positioned surrounding the Micro LED chip and the TFT substrate positioned bottom side, it decreases light efficiency from the front side of the Micro LED panel.

SUMMARY

A technical problem to be solved by the disclosure is to provide a Micro LED display panel and a method of manufacturing Micro LED display panel with increased the extraction efficiency, further narrowed size of the Micro LED chip, and enhanced resolution of the display panel.

An objective of the disclosure is achieved by following embodiments. In particular, a method of manufacturing Micro LED display panel, comprising
 providing a TFT substrate;
 opening a channel which array positioned on a top of the TFT substrate for exposing a source or a drain inside;
 preparing a planar layer on the top of the TFT substrate;
 opening a hole on the planar layer and exposing the source or the drain corresponding to the channel, and forming a countersink hole with inclined inner wall connecting to the channel on the planar layer;
 preparing a bottom electrode in the countersink hole and the channel;
 transferring a Micro LED chip to a bottom surface of the bottom electrode;
 preparing a first passivation layer and totally covering the first passivation layer on the Micro LED chip, the bottom electrode and a top surface of the planar layer;
 opening a via hole on surface of the passivation layer for exposing the Micro LED chip; and
 preparing a top electrode in the via hole.

In an embodiment, in the step of preparing the bottom electrode in the countersink hole and the channel comprising
 preparing a reflective layer in the countersink hole and the channel by vacuum deposition;
 protecting one region of the reflective layer in the countersink hole by mask, and removing the other region of the reflective layer that is not protected by mask by chemical wet etching.

In an embodiment, thickness of the planar layer is 2±1 μm.

In an embodiment, in the step of transferring the Micro LED chip to a bottom surface of the bottom electrode, bonding the Micro LED chip and the bottom electrode by a bonded layer.

In an embodiment, the Micro LED chip comprises an light-emitting layer, a N type semiconductor layer and a P type semiconductor layer respectively positioned at two sides of the light-emitting layer; while transferring the Micro LED chip to a bottom surface of the bottom electrode, the P type semiconductor layer is positioned more far away from the TFT substrate than the N type semiconductor layer, and height of the flange is not less than height of the light-emitting layer.

According to another aspect of the disclosure, the disclosure further provides a Micro LED display panel, comprising a TFT substrate, a bottom electrode positioned on top of the TFT substrate, a Micro LED chip positioned on the bottom electrode, a top electrode positioned on top of the Micro LED chip, and a protecting layer covering the TFT substrate and the Micro LED chip, wherein the bottom electrodes are arranged as an array on top of the TFT substrate with space between every two adjacent bottom electrodes; wherein a bottom of the bottom electrode is extending and conducting with a source or a drain of the TFT substrate, and at least partial of the top electrode is located outside the protecting layer the bottom electrode is a reflective type electrode and each of the bottom electrodes comprises a bottom surface pasting to top surface of the TFT substrate, and a flange positioned around each of the correspondingly Micro LED chips, and the flange is trumpet-shaped.

In an embodiment, an inner wall of the flange is arc.

In an embodiment, the protecting layer comprises a planar layer and a first passivation layer, the planar layer on which a countersink hole enlarging towards a top surface is opened is positioned on the top surface of the TFT substrate, the bottom electrode is embedded in the countersink hole and the flange is pasting to an inner wall of the countersink hole; the passivation layer is covering top of the planar layer and covering the bottom electrode and the Micro LED chip, and partial of the top electrode is embedded in the passivation layer.

In an embodiment, the Micro LED chip comprises an light-emitting layer, a N type semiconductor layer and a P type semiconductor layer respectively positioned at two sides of the light-emitting layer; while transferring the Micro LED chip to a bottom surface of the bottom electrode, the P type semiconductor layer is positioned more far away from the TFT substrate than the N type semiconductor layer, and height of the flange is not less than height of the light-emitting layer.

In an embodiment, height of the planar layer is not higher than height of the flange.

According to the bottom electrode of the invention has a reflective structure which could secondary use the light emitting from the Micro LED, and improves the situation of the emission light from the Micro LED is absorbed by the TFT substrate and surrounding protecting layer. It could enhance the extraction efficiency of the Micro LED, such that narrowed size of the Micro LED chip, and enhanced resolution of the display panel.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED THE EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

The disclosure will be further described in detail with reference to accompanying drawings and preferred embodiments as follows.

Figure 1:
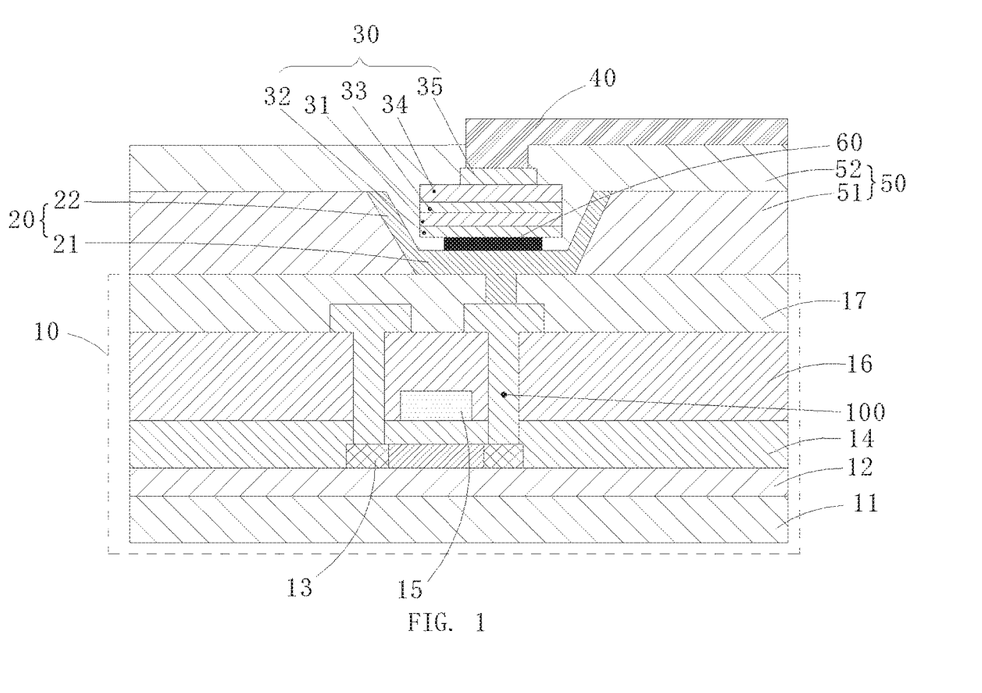
FIG. 1 is a structural schematic view of a Micro LED display panel according to an embodiment of the disclosure.

Please refer to FIG. 1. The Micro LED display panel of this embodiment in this invention comprises a TFT substrate 10, a bottom electrode 20 is positioned on top of the TFT substrate 10, a Micro LED chip 30 is positioned on the bottom electrode 20, a top electrode 40 is positioned on top of the Micro LED chip 30, and a protecting layer 50 is covering the TFT substrate 10 and the Micro LED chip 30. Further, a plurality of the bottom electrode is provided and the bottom electrodes are positioned arranged as an array on top of the TFT substrate 10 with space between every two adjacent bottom electrodes. The bottom of the bottom electrode 20 is extending and conducting with a source or a drain 100 of the TFT substrate 10, and at least partial of the top electrode 40 is located outside the protecting layer 50. The bottom electrode 20 is a reflective type electrode like a bowl-shaped, and each of the bottom electrodes 20 comprises a bottom surface 21 pasting to top surface of the TFT substrate 10, and a flange 22 is positioned around each of the correspondingly Micro LED chips 30, and the flange 22 is trumpet-shaped.

The Micro LED chip 30 comprises an light-emitting layer 31, a N type semiconductor layer 32 and a P type semiconductor layer 33 respectively positioned at two sides of the light-emitting layer 31, a transparent conducting layer 34 is positioned on surface of the P type semiconductor layer 33 and a P type metal electrode 35 is positioned on surface of the transparent conducting layer 34. The P type semiconductor layer 33 is positioned more far away from the TFT substrate 10 than the N type semiconductor layer 32. The N type semiconductor layer 32 is bonding to the bottom electrode 20 by a bonded layer 60. The top electrode 40 is extending and contacting with the P type metal electrode 35.

In an embodiment, the protecting layer 50 comprises a planar layer 51 and a first passivation layer 52, the planar layer 51 is positioned on the top surface of the TFT substrate 10 on which a countersink hole 510 enlarging towards the top expanding, the bottom electrode 20 is embedded in the countersink hole 510 and the flange 22 is pasting to an inner wall of the countersink hole 510. The first passivation layer 52 is covering on top of the planar layer 51 and covering the bottom electrode 20 and the Micro LED chip 30, and partial of the top electrode 40 is embedded in the first passivation layer 52.

The bottom electrode 20 is a metal has highly reflective property such as Ag. The N type semiconductor layer 32 of the Micro LED chip 30 is connecting with the bottom surface 21 of the bottom electrode by the bonded layer 60. After the Micro LED chip bonded with the bottom surface 20, the Micro LED chip 30 is located inside the bottom electrode 20 has bowel-shaped. Because the bottom electrode 21 has bottom surface 21 and a flange 22 connecting with the bottom surface 21. In one hand, bottom surface 21 could block absorb the light emitting from the Micro LED chip 30 by the TFT substrate 10. Therefore, the light emitting to the bottom surface 21 could be reflected to the Micro LED chip 30 or flange 22 for secondary used. On another hand, the flange 22 is positioned around each of the correspondingly Micro LED chips 30, and block the light enter to absorbing organic planar layer 51. And, the flange 22 is trumpet-shaped so that could reflect the light which emitted to the planar layer 51 back to the bottom surface 21, it achieves to the secondary used for partial light. Therefore, the bottom electrode 20 could enhance luminous efficiency from multiple ways and let size of the Micro LED chip 30 could be smaller and satisfy luminous requirement. It indirectly enhances resolution of the display panel.

More specifically, the height of the flange 22 is not less than height of the light-emitting layer 31. The height of the planar layer 51 is not higher than the height of the flange 22. This embodiment illustrates the flange 22 is higher than height of the light-emitting layer 31, and flush with the planar layer 51. So that the flange 22 cloud block all of the light emission to the planar layer 51 and maximum reflect the light diverging toward the surrounding. At the same time, it is also easily manufacturing the flange 22.

In this embodiment, the inner wall of the flange 22 is incline plane. It is noted that in other embodiment, the inner wall of the flange 22 is arc, the bottom surface 21 of the inner wall could be arc such that the inner surface of the bottom electrode 20 is part of a sphere and let more light directly emission toward front of the display panel.

Except for the source/the drain 100, the TFT substrate 10 further comprises a substrate 11, a buffer layer 12 is positioned on the substrate 11, an active layer 13 is positioned on the buffer layer 12, a grid insulating layer 14 is positioned on the buffer layer 12 and covering the active layer 13, a grid 15 is positioned on the grid insulating layer 14, and a dielectric layer 16 is positioned on the grid 15 and a second passivation layer 17 is covering on the dielectric layer 16, the second passivation layer 17 is totally covering the source and the drain and avoids the hole collapsing while opening the hole, the source/drain 100 is positioned on surface of the dielectric layer 16 and extending and conducting with the active layer 13 positioned under it.

The planar layer 51 is covering surface of the second passivation layer 17 and ensuring the bottom surface 21 of the bottom electrode 20 and the first passivation layer 52 have flat manufacturing surface. The bottom electrode 20 is positioned on surface of the second passivation layer 17, and passes through the second passivation layer 17, and then extending to surface of the source/drain 100 of the TFT substrate 10.

Please refer to FIG. 2 through FIG. 6, a method of manufacturing Micro LED display panel is provided by this invention, the method comprises following steps.

Figure 2:
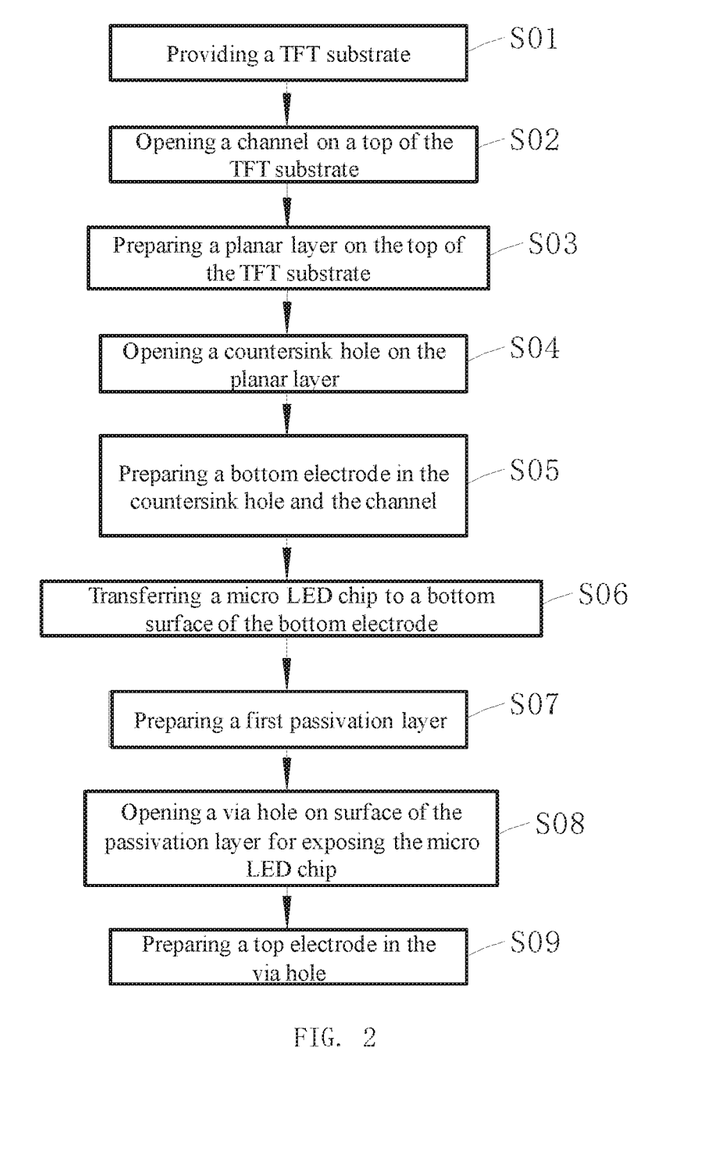
FIG. 2 is a manufacturing flow chart diagram of a Micro LED display panel according to an embodiment of the disclosure.
Figure 3:
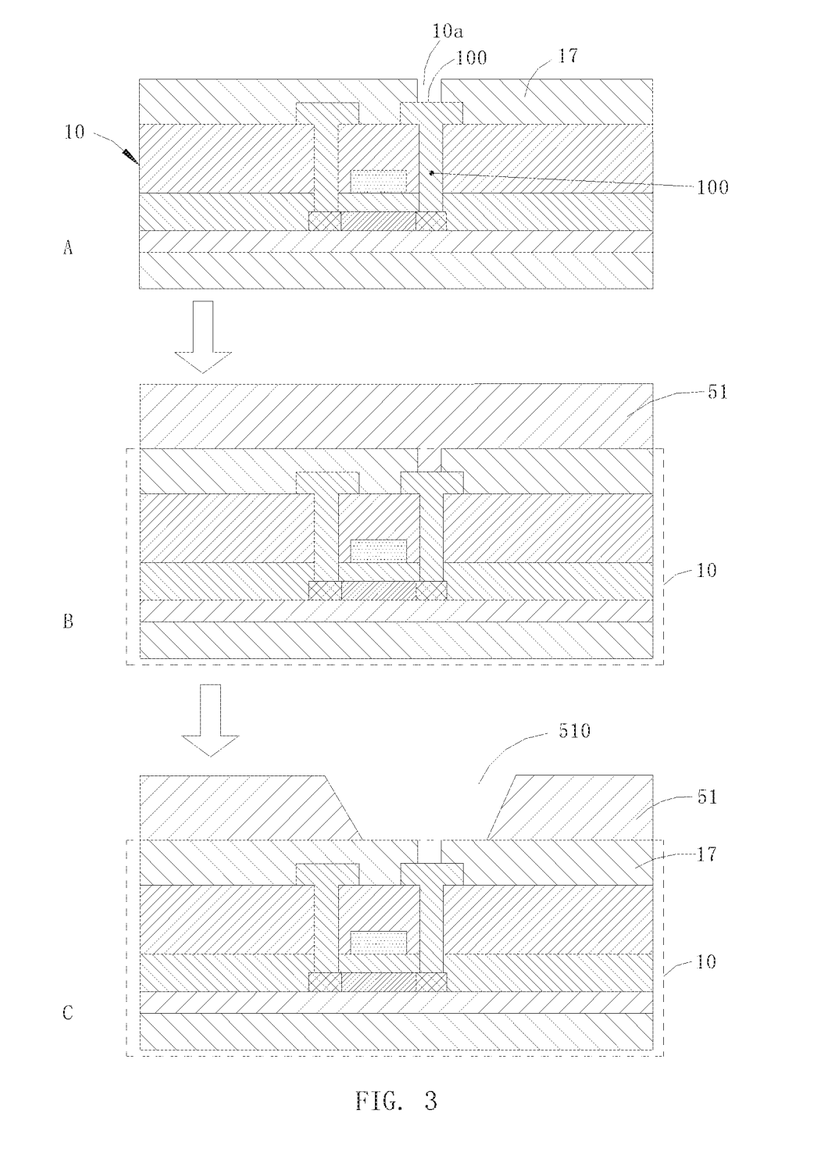
FIG. 3 is a first part of the manufacturing flow chart diagram of a Micro LED display panel according to an embodiment of the disclosure.
Figure 4:
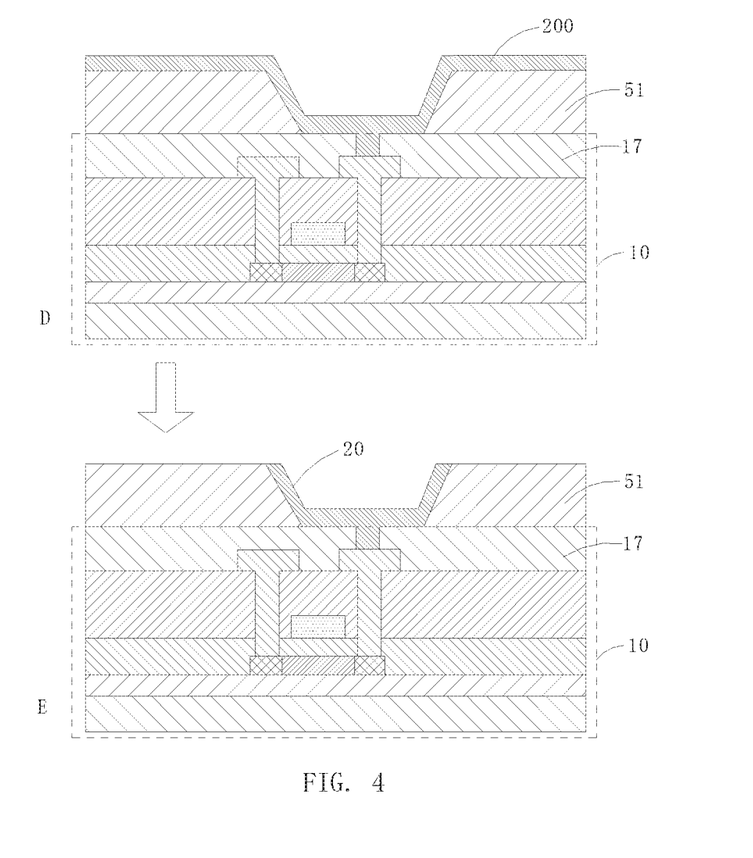
FIG. 4 is a second part of the manufacturing flow chart diagram of a Micro LED display panel according to an embodiment of the disclosure.
Figure 5:
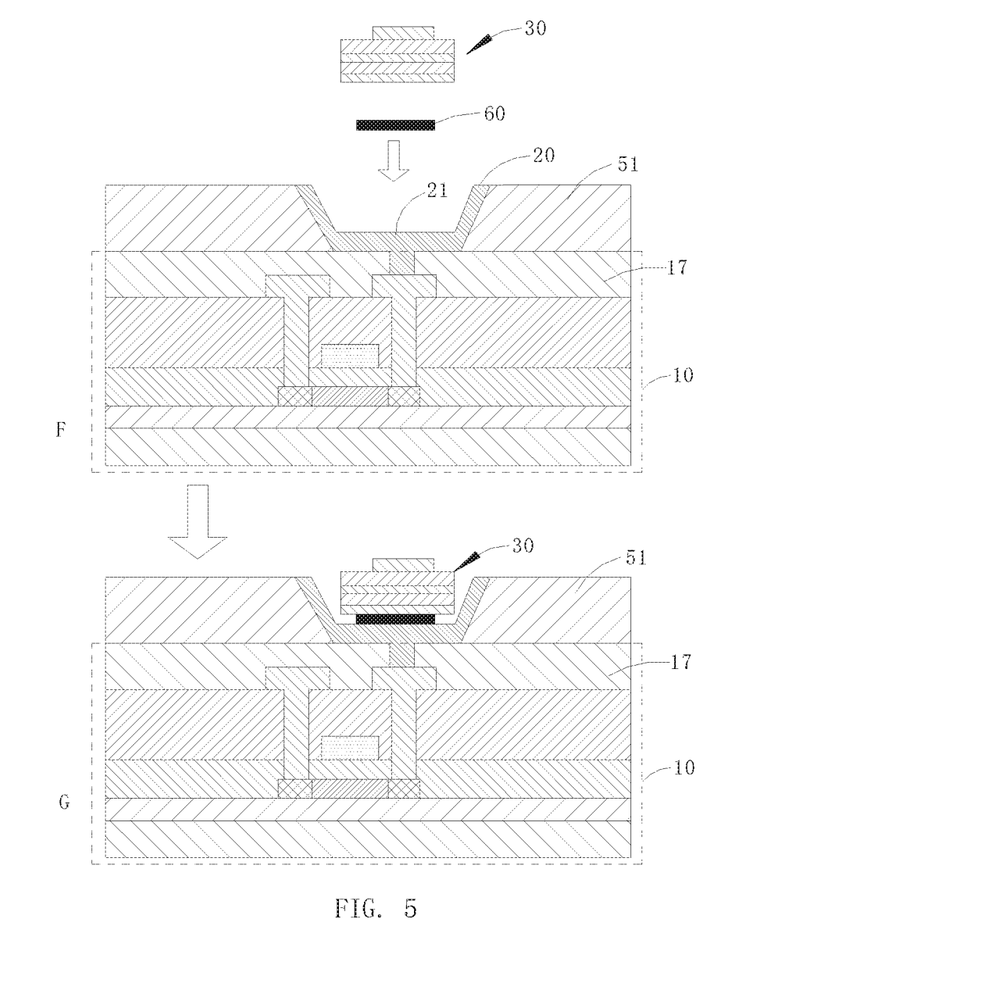
FIG. 5 is third part of the manufacturing flow chart diagram of a Micro LED display panel according to an embodiment of the disclosure.

S01, providing a TFT substrate 10;

S02, opening a channel 10a which is array positioned on a top of the TFT substrate 10 for exposing source or drain inside (the A step in FIG. 3);

S03, preparing a planar layer 51 on the top of the TFT substrate 10 (the B step in FIG. 3), thickness of the planar layer 51 is 2 μm, and the thickness could be adjusted between a range of ±1 μm;

S04, opening a hole on the planar layer 51 and exposing the source or the drain corresponding to the channel 10a, and forming a countersink hole 510 with inclined inner wall connecting to the channel 10a on the planar layer 51 (the C step in FIG. 3);

S05, preparing a bottom electrode 20 in the countersink hole 510 and the channel 10a. The bottom of the bottom electrode 20 is extending and conducting with source or drain 100 of the TFT substrate 10. Please refer to FIG. 4. Firstly, preparing a reflective layer 200 in the countersink hole 510 and the channel 10a by vacuum deposition (the D step in FIG. 4). And then, protecting one region of the reflective layer 200 which is positioned in the countersink hole 510 by mask, and removing the other region of the reflective layer 200 that is not protected by mask according to chemical wet etching (the E step in FIG. 4);

S06, transferring a Micro LED chip 30 to a bottom surface 21 of the bottom electrode 20 (shown as FIG. 5). The P type semiconductor layer 33 of the Micro LED chip 30 is positioned more far away from the TFT substrate 10 than the N type semiconductor layer 32. While transferring the Micro LED chip 30 to the bottom surface 21 of the bottom electrode 20, bonding the N type semiconductor layer 32 of the Micro LED chip 30 and the bottom surface 21 of the bottom electrode 20 by a bonded layer 60 such that the height of the flange 22 is not less than height of the light-emitting layer 31.

Figure 6:
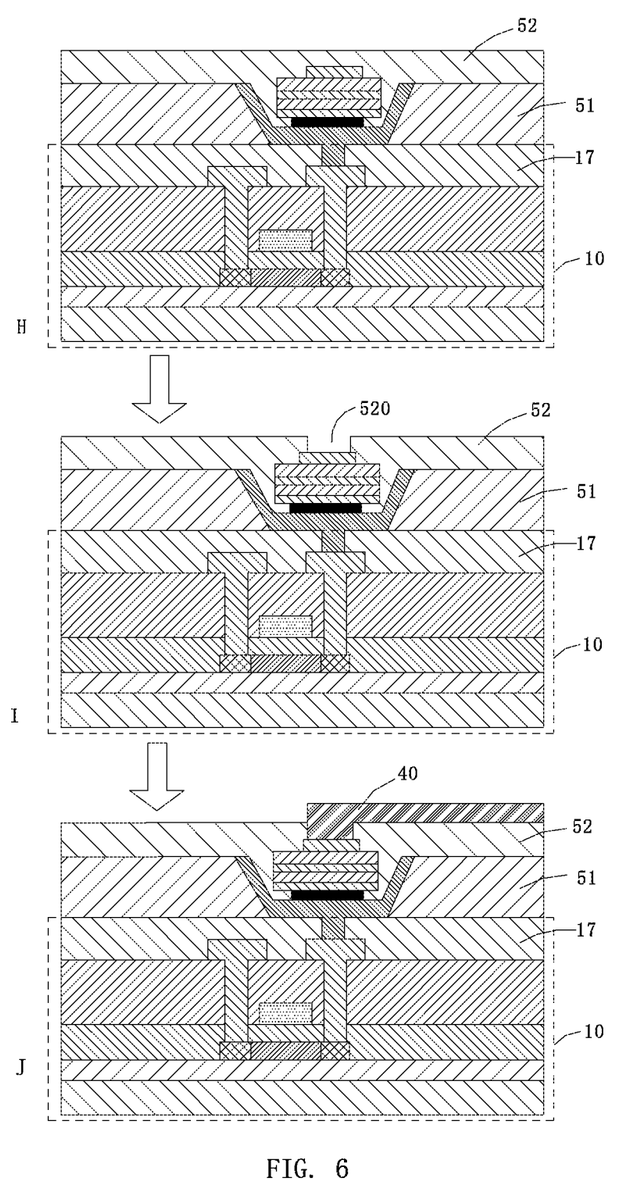
FIG. 6 is a fourth part of the manufacturing flow chart diagram of a Micro LED display panel according to an embodiment of the disclosure.

S07, preparing a first passivation layer 52 and totally covering the first passivation layer 52 on the Micro LED chip 30, the bottom electrode 20 and a top surface of the planar layer 51 (the H step of FIG. 6);

S08, opening a via hole 520 on surface of the first passivation layer 52 for exposing the Micro LED chip 30 (the I step of FIG. 6); and S09, preparing a top electrode 40 in the via hole 520 (the J step of FIG. 6). The bottom of the top electrode 40 is positioned in the via hole 520, extending and contacting to the P type metal electrode 35, and the top of the top electrode 40 is pasting to surface of the first passivation layer 52.

According to the bottom electrode of the invention has a reflective structure which could secondary use the light emitting from the Micro LED, and improves the situation of the emission light from the Micro LED is absorbed by the TFT substrate and surrounding protecting layer. It could enhance the extraction efficiency of the Micro LED, such that narrowed size of the Micro LED chip, and enhanced resolution of the display panel.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A method of manufacturing Micro LED display panel, comprising providing a TFT substrate;
   opening a channel which array positioned on a top of the TFT substrate for exposing a source or a drain inside;
   preparing a planar layer on the top of the TFT substrate;
   opening a hole on the planar layer and exposing the source or the drain corresponding to the channel, and forming a countersink hole with inclined inner wall connecting to the channel on the planar layer;
   preparing a bottom electrode in the countersink hole and the channel;
   transferring a Micro LED chip to a bottom surface of the bottom electrode;
   preparing a first passivation layer and totally covering the first passivation layer on the Micro LED chip, the bottom electrode and a top surface of the planar layer;
   opening a via hole on surface of the passivation layer for exposing the Micro LED chip; and
   preparing a top electrode in the via hole;
   wherein the bottom electrode is a reflective type electrode, the bottom electrode comprises a bottom surface disposed in the channel, and a trumpet-shaped flange pasted to an inner wall of the countersink hole.

2. The method of manufacturing Micro LED display panel according to claim 1, wherein in the step of preparing the bottom electrode in the countersink hole and the channel comprising
   preparing a reflective layer in the countersink hole and the channel by vacuum deposition;
   protecting one region of the reflective layer in the countersink hole by mask, and removing the other region of the reflective layer that is not protected by mask by chemical wet etching.

3. The method of manufacturing Micro LED display panel according to claim 2, wherein in the step of transferring the Micro LED chip to a bottom surface of the bottom electrode, bonding the Micro LED chip and the bottom electrode by a bonded layer.

4. The method of manufacturing Micro LED display panel according to claim 3, wherein the Micro LED chip comprises an light-emitting layer, a N type semiconductor layer and a P type semiconductor layer respectively positioned two sides of the light-emitting layer; while transferring the Micro LED chip to a bottom surface of the bottom electrode, the P type semiconductor layer is positioned more far away from the TFT substrate than the N type semiconductor layer, and height of the flange is not less than height of the light-emitting layer.

5. The method of manufacturing Micro LED display panel according to claim 1, wherein thickness of the planar layer is 2±1 μm.

6. The method of manufacturing Micro LED display panel according to claim 1, wherein in the step of transferring the Micro LED chip to a bottom surface of the bottom electrode, bonding the Micro LED chip and the bottom electrode by a bonded layer.

7. The method of manufacturing Micro LED display panel according to claim 6, wherein the Micro LED chip comprises an light-emitting layer, a N type semiconductor layer and a P type semiconductor layer respectively positioned at two sides of the light-emitting layer; while transferring the Micro LED chip to a bottom surface of the bottom electrode, the P type semiconductor layer is positioned more far away from the TFT substrate than the N type semiconductor layer, and height of the flange is not less than height of the light-emitting layer.

8. A method of manufacturing Micro LED display panel, comprising providing a TFT substrate;
opening a channel which array positioned on a top of the TFT substrate for exposing a source or a drain inside;
preparing a planar layer on the top of the TFT substrate, and thickness of the planar layer is 2±1 μm;
opening a hole on the planar layer and exposing the source or the drain corresponding to the channel, and forming a countersink hole with inclined inner wall connecting to the channel on the planar layer;
preparing a bottom electrode in the countersink hole and the channel;
transferring a Micro LED chip to a bottom surface of the bottom electrode;
preparing a first passivation layer and totally covering the first passivation layer on the Micro LED chip, the bottom electrode and a top surface of the planar layer;
opening a via hole on surface of the passivation layer for exposing the Micro LED chip; and
preparing a top electrode in the via hole;
wherein the bottom electrode is a reflective type electrode, the bottom electrode comprises a bottom surface disposed in the channel, and a trumpet-shaped flange pasted to an inner wall of the countersink hole.

9. A Micro LED display panel, comprising
a TFT substrate,
a bottom electrode positioned on top of the TFT substrate,
a Micro LED chip positioned on the bottom electrode,
a top electrode positioned on top of the Micro LED chip, and
a protecting layer covering the TFT substrate and the Micro LED chip,
wherein the bottom electrodes are arranged as an array on top of the TFT substrate with space between every two adjacent bottom electrodes;
wherein a bottom of the bottom electrode is extending and conducting with a source or a drain of the TFT substrate, and at least partial of the top electrode is located outside the protecting layer;
the bottom electrode is a reflective type electrode and each of the bottom electrodes comprises a bottom surface pasting to top surface of the TFT substrate, and a flange positioned around each of the correspondingly Micro LED chips, and the flange is trumpet-shaped; and wherein the protecting layer comprises a planar layer and a first passivation layer, the planar layer on which a countersink hole enlarging towards a top surface is opened is positioned on the top surface of the TFT substrate, the bottom electrode is embedded in the countersink hole-and the flange is pasting to an inner wall of the countersink hole; the first passivation layer is covering on top of the planar layer and covering the bottom electrode and the Micro LED chip, and partial of the top electrode is embedded in the first passivation layer.

10. The Micro LED display panel according to claim 9, wherein an inner wall of the flange is arc.

11. The Micro LED display panel according to claim 10, wherein the Micro LED chip comprises an light-emitting layer, a N type semiconductor layer and a P type semiconductor layer respectively positioned at two sides of the light-emitting layer; the P type semiconductor layer is positioned more far away from the TFT substrate than the N type semiconductor layer, and height of the flange is not less than height of the light-emitting layer.

12. The Micro LED display panel according to claim 11, wherein height of the planar layer is not higher than height of the flange.

13. The Micro LED display panel according to claim 9, wherein the Micro LED chip comprises an light-emitting layer, a N type semiconductor layer and a P type semiconductor layer respectively positioned at two sides of the light-emitting layer; the P type semiconductor layer is positioned more far away from the TFT substrate than the N type semiconductor layer, and height of the flange is not less than height of the light-emitting layer.

14. The Micro LED display panel according to claim 13, wherein height of the planar layer is not higher than height of the flange.

* * * * *